United States Patent
Kozai et al.

(10) Patent No.: US 9,396,976 B2
(45) Date of Patent: Jul. 19, 2016

(54) CUTTING APPARATUS

(71) Applicant: DISCO CORPORATION, Tokyo (JP)

(72) Inventors: Hirohiko Kozai, Tokyo (JP); Yuji Nakanishi, Tokyo (JP)

(73) Assignee: Disco Corporation, Tokyo (JP)

( * ) Notice: Subject to any disclaimer, the term of this patent is extended or adjusted under 35 U.S.C. 154(b) by 207 days.

(21) Appl. No.: 14/215,315

(22) Filed: Mar. 17, 2014

(65) Prior Publication Data

US 2014/0298969 A1    Oct. 9, 2014

(30) Foreign Application Priority Data

Apr. 4, 2013 (JP) .................................. 2013-078333

(51) Int. Cl.

| B26D 1/14 | (2006.01) |
|---|---|
| B26D 5/08 | (2006.01) |
| B27B 29/08 | (2006.01) |
| B26F 3/00 | (2006.01) |
| B26F 3/02 | (2006.01) |
| H01L 21/67 | (2006.01) |
| B26D 7/06 | (2006.01) |

(52) U.S. Cl.
CPC ........ *H01L 21/67092* (2013.01); *B26D 7/0616* (2013.01); *Y10T 83/7726* (2015.04)

(58) Field of Classification Search
CPC ............ H01L 21/67092; B26D 7/0616; Y10T 83/7726
USPC ............ 83/821, 713–718, 727, 581; 384/535, 384/536, 581, 582; 225/103, 93–97
See application file for complete search history.

(56) References Cited

U.S. PATENT DOCUMENTS

| 4,277,998 | A | * | 7/1981 | Mayo ....................... | B23Q 1/50 83/404.1 |
|---|---|---|---|---|---|
| 4,676,129 | A | * | 6/1987 | Blanco ................. | B23D 59/008 83/155 |
| 5,943,239 | A | * | 8/1999 | Shamblin ............. | B23D 59/008 700/160 |
| 6,102,023 | A | * | 8/2000 | Ishiwata ................ | B28D 5/024 125/13.01 |
| 6,142,726 | A | * | 11/2000 | Westerfield, Jr. ......... | B23C 3/12 414/808 |
| 6,606,985 | B2 | * | 8/2003 | Negishi ..................... | B27B 5/32 125/13.01 |
| 7,179,721 | B2 | * | 2/2007 | Nagai ................ | B23K 26/0057 257/E21.599 |
| 7,316,174 | B2 | * | 1/2008 | Sekiya ................... | B28D 5/024 125/13.01 |
| 7,329,079 | B2 | * | 2/2008 | Ohkawara ............. | H01L 21/681 414/217 |
| 7,338,345 | B2 | * | 3/2008 | Fujinami ................ | B28D 5/023 125/13.01 |
| 7,611,968 | B2 | * | 11/2009 | Kobayashi .......... | H01L 21/2683 257/E21.347 |

(Continued)

FOREIGN PATENT DOCUMENTS

JP    11-274109    10/1999

*Primary Examiner* — Ghassem Alie
*Assistant Examiner* — Bharat C Patel
(74) *Attorney, Agent, or Firm* — Greer Burns & Crain Ltd.

(57) ABSTRACT

Cutting apparatus includes first and second cutting units that are provided on one outside surface of a guide rail unit and are movable on first Y-axis guide rails and third and fourth cutting units that are provided on the other side surface and are movable on second Y-axis guide rails. A first spindle of the first cutting unit and a second spindle of the second cutting unit are disposed in a hung state with cutting blades opposed to each other and a third spindle of the third cutting unit and a fourth spindle of the fourth cutting unit are disposed in a hung state with cutting blades opposed to each other. The first and third spindles are so configured as to be movable in juxtaposition in the X-axis direction and the second and fourth spindles are so configured as to be movable in juxtaposition in the X-axis direction.

2 Claims, 3 Drawing Sheets

(56) References Cited

U.S. PATENT DOCUMENTS

| | | | |
|---|---|---|---|
| 7,863,160 B2* | 1/2011 | Iizuka | B23K 26/0648 438/463 |
| 7,982,279 B2* | 7/2011 | Kumagai | H01L 21/78 257/276 |
| 8,025,556 B2* | 9/2011 | Kajiyama | B24B 37/042 451/41 |
| 8,404,999 B2* | 3/2013 | Togashi | B23K 26/0673 219/121.67 |
| 8,518,730 B2* | 8/2013 | Hoshino | H01L 33/0095 257/772 |
| 8,657,648 B2* | 2/2014 | Yamanaka | H01L 21/304 451/11 |
| 2002/0184982 A1* | 12/2002 | Smith | B23D 59/001 83/89 |
| 2006/0130967 A1* | 6/2006 | Fujisawa | H01L 21/67092 156/345.1 |
| 2006/0197260 A1* | 9/2006 | Yoshikawa | B23K 26/10 264/482 |
| 2008/0102542 A1* | 5/2008 | Negishi | H01L 21/67092 438/16 |
| 2009/0061545 A1* | 3/2009 | Donohoe | H01L 21/02032 438/16 |

* cited by examiner

CUTTING APPARATUS

BACKGROUND OF THE INVENTION

1. Field of the Invention

The present invention relates to cutting apparatus and particularly to cutting apparatus to cut a workpiece such as a semiconductor wafer along streets.

2. Description of the Related Art

In a semiconductor device manufacturing process, streets (planned dividing lines) are formed on a surface of a semiconductor wafer in a lattice manner and circuits such as ICs and LSIs are formed in regions partitioned by the streets. The semiconductor wafer is cut along the streets by cutting apparatus to be divided into the individual semiconductor chips. As dividing apparatus to divide the semiconductor wafer in this manner, generally cutting apparatus as dicing apparatus is used. This cutting apparatus includes a chuck table to hold a workpiece and a cutting unit having a cutting blade to cut the workpiece held by the chuck table. By carrying out relative cutting feed of the chuck table with rotation of the cutting blade, the semiconductor wafer is cut.

In association with recent increase in the diameter of the workpiece, cutting apparatus provided with four-axis spindles has been proposed to enhance the productivity (refer to Japanese Patent Laid-open No. Hei 11-274109). In the cutting apparatus described in Japanese Patent Laid-open No. Hei 11-274109, four spindles each having the axial core along the Y-axis direction are juxtaposed in the X-axis direction at predetermined intervals.

SUMMARY OF THE INVENTION

However, the cutting apparatus described in Japanese Patent Laid-open No. Hei 11-274109 has problems that the apparatus area increases and it takes a long time to cut one line because the four-axis spindles are juxtaposed in the X-axis direction at predetermined intervals.

So, an object of the present invention is to provide cutting apparatus capable of preventing increase in the apparatus area due to increase in the diameter of the workpiece and enhancing the productivity.

In accordance with an aspect of the present invention, there is provided cutting apparatus includes an X-axis guide rail extended along an X-axis direction, a chuck table that is disposed movably along the X-axis guide rail and has a holding surface to hold a workpiece, and a cutting feed mechanism that carries out cutting feed of the chuck table along the X-axis guide rail. The cutting apparatus further includes a Y-axis guide rail that is so disposed as to extend along a direction perpendicular to the X-axis guide rail, a cutting unit that is disposed movably along the Y-axis guide rail and is to cut the workpiece held by the chuck table, and a gate-shaped support frame having a pair of support column parts that sandwich the X-axis guide rail and are provided upright opposed to each other and a guide rail unit that straddles the X-axis guide rail and spans a space between the pair of support column parts. The gate-shaped support frame has an opening that permits movement of the chuck table. The Y-axis guide rail is formed of a first Y-axis guide rail that is so disposed as to extend on one side surface of the guide rail unit and a second Y-axis guide rail that is so disposed as to extend on the other side surface of the guide rail unit. The cutting unit includes a first cutting unit having a first cutting blade and a second cutting unit having a second cutting blade that are each disposed movably along the first Y-axis guide rail, and a third cutting unit having a third cutting blade and a fourth cutting unit having a fourth cutting blade that are each disposed movably along the second Y-axis guide rail. The first cutting unit has a first indexing feed base movably disposed on the first Y-axis guide rail, a first cutting feed base disposed over the first indexing feed base movably in a direction perpendicular to the holding surface of the chuck table, and a first spindle that is mounted to the first cutting feed base and has the first cutting blade. The second cutting unit has a second indexing feed base movably disposed in a direction along the first Y-axis guide rail, a second cutting feed base disposed over the second indexing feed base movably in a direction perpendicular to the holding surface of the chuck table, and a second spindle that is mounted to the second cutting feed base and has the second cutting blade. The first spindle and the second spindle are disposed opposed to each other in a hung state in the opening of the gate-shaped support frame in such a manner that the first cutting blade and the second cutting blade face each other. The third cutting unit has a third indexing feed base movably disposed on the second Y-axis guide rail, a third cutting feed base disposed over the third indexing feed base movably in a direction perpendicular to the holding surface of the chuck table, and a third spindle that is mounted to the third cutting feed base and has the third cutting blade. The fourth cutting unit has a fourth indexing feed base movably disposed in a direction along the second Y-axis guide rail, a fourth cutting feed base disposed over the fourth indexing feed base movably in a direction perpendicular to the holding surface of the chuck table, and a fourth spindle that is mounted to the fourth cutting feed base and has the fourth cutting blade. The third spindle and the fourth spindle are disposed opposed to each other in a hung state in the opening of the gate-shaped support frame in such a manner that the third cutting blade and the fourth cutting blade face each other. The first spindle and the third spindle are movable in juxtaposition to each other in the opening of the support frame and the second spindle and the fourth spindle are movable in juxtaposition to each other in the opening of the support frame.

According to this configuration, on the first Y-axis guide rail and the second Y-axis guide rail disposed on both side surfaces of the guide rail unit, the spindles opposed to each other in the Y-axis direction are each disposed in a hung state in the opening of the support frame with the cutting blades opposed to each other. Therefore, four-axis spindles can be disposed without increasing the size of the whole apparatus. This can prevent increase in the apparatus area due to increase in the diameter of the workpiece and enhance the productivity.

In the cutting apparatus of the present invention, it is preferable that at least two X-axis guide rails are juxtaposed as the X-axis guide rail and the cutting feed mechanism and the chuck table are disposed over each of the X-axis guide rails. According to the present invention, it is possible to provide cutting apparatus capable of preventing increase in the apparatus area due to increase in the diameter of the workpiece and enhancing the productivity.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
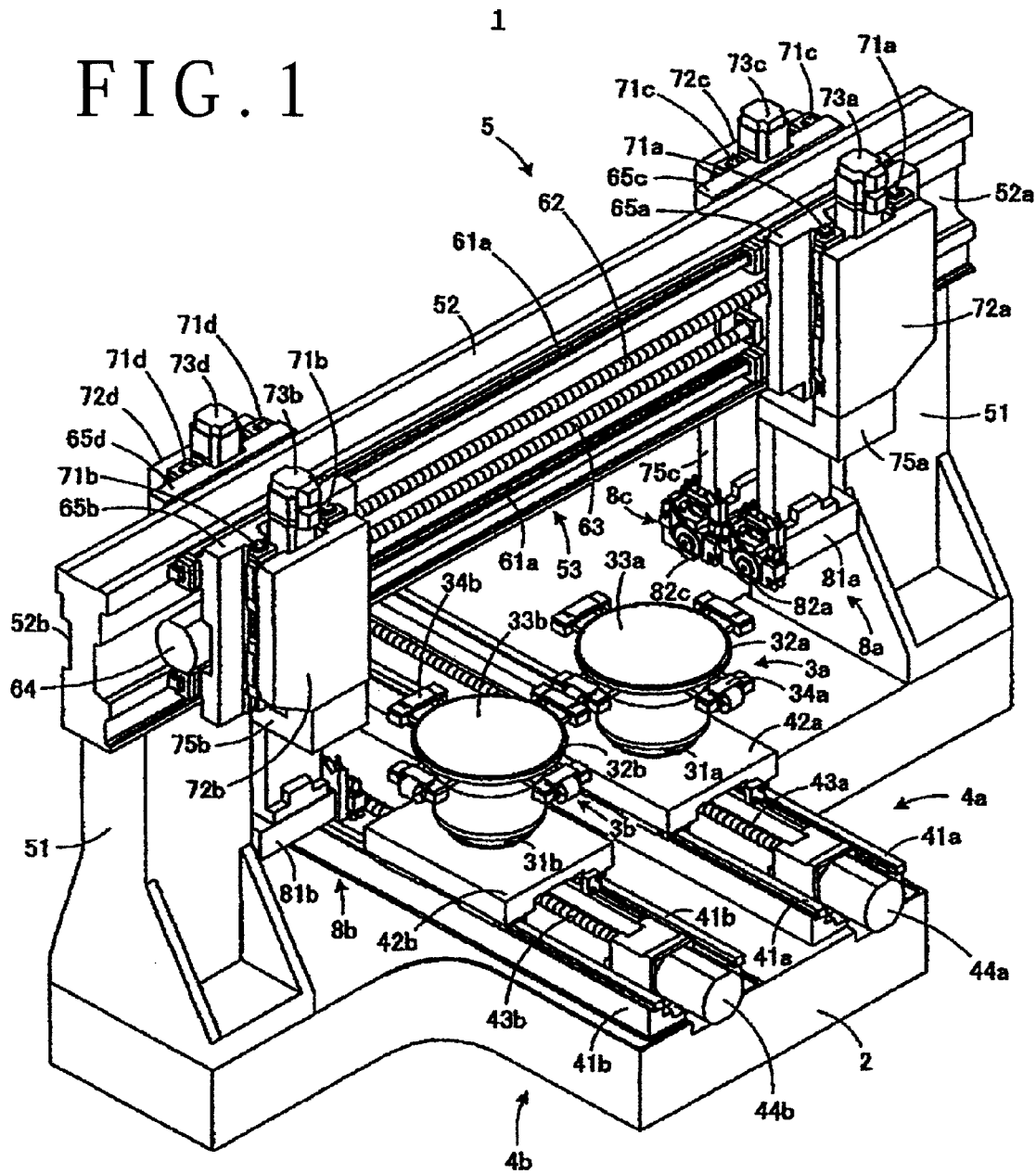
FIG. 1 is a perspective view of cutting apparatus according to a first embodiment of the present invention.
Figure 1:
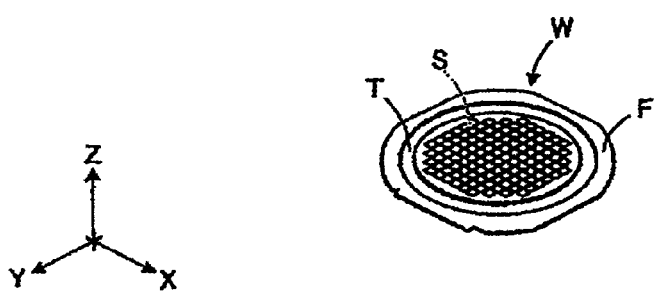

Embodiments of the present invention will be described in detail below with reference to the accompanying drawings. FIG. 1 is a perspective view of cutting apparatus according to a first embodiment of the present invention. First, prior to explanation of the cutting apparatus according to the present embodiment, a semiconductor wafer (workpiece) as a cutting target will be briefly explained.

As shown in FIG. 1, a semiconductor wafer W is formed into a substantially circular disc shape. A surface of the semiconductor wafer W is partitioned into plural regions by streets (planned dividing lines) S arranged in a lattice manner and devices such as ICs and LSIs are formed in these partitioned regions. Furthermore, the semiconductor wafer W is supported by a ring-shaped frame F with the intermediary of an adhesive tape T. Although the present embodiment will be explained by employing the semiconductor wafer W such as a silicon wafer as an example of the workpiece, the embodiment is not limited to this configuration. For example, the following objects may be the workpiece: adhesive members such as a die attach film (DAF) bonded to the semiconductor wafer W; packages of semiconductor products; inorganic material substrates based on ceramic, glass, or sapphire ($Al_2O_3$); various kinds of electric components; and various kinds of processing materials for which processing position accuracy of micron order is required.

Next, the cutting apparatus according to the present embodiment will be explained. As shown in FIG. 1, cutting apparatus 1 is so configured as to be capable of cutting two semiconductor wafers W held by a first chuck table 3a and a second chuck table 3b provided over a pedestal 2 by a first cutting unit 8a, a second cutting unit 8b, a third cutting unit 8c, and a fourth cutting unit 8d (see FIG. 2A).

On the pedestal 2, a first chuck table moving mechanism (cutting feed mechanism) 4a that moves the first chuck table 3a in the X-axis direction (cutting feed direction) and a second chuck table moving mechanism (cutting feed mechanism) 4b that moves the second chuck table 3b in the X-axis direction are provided.

The first chuck table moving mechanism 4a has a pair of X-axis guide rails 41a extending along the X-axis direction on the pedestal 2 and an X-axis table 42a that is slidably provided on the pair of X-axis guide rails 41a and is driven by a motor. The first chuck table 3a is provided on the X-axis table 42a. A nut part (not shown) is formed on the back surface side of the X-axis table 42a and a ball screw 43a is screwed to this nut part. A drive motor 44a is connected to one end part of the ball screw 43a and the ball screw 43a is rotationally driven by this drive motor 44a.

The second chuck table moving mechanism 4b has a configuration similar to that of the first chuck table moving mechanism 4a. Specifically, the second chuck table moving mechanism 4b has a pair of X-axis guide rails 41b extending along the X-axis direction on the pedestal 2 and an X-axis table 42b that is slidably provided on the pair of X-axis guide rails 41b and is driven by a motor. The second chuck table 3b is provided on the X-axis table 42b. A nut part (not shown) is formed on the back surface side of the X-axis table 42b and a ball screw 43b is screwed to this nut part. A drive motor 44b is connected to one end part of the ball screw 43b and the ball screw 43b is rotationally driven by this drive motor 44b.

The first chuck table 3a has a θ table 31a that is fixed to the upper surface of the X-axis table 42a and is capable of rotating about the Z-axis and a holding part 32a that is provided on the θ table 31a and sucks and holds the semiconductor wafer W. The holding part 32a has a circular disc shape with a predetermined thickness and a holding surface 33a is formed at the center part of the upper surface thereof. The holding surface 33a is a surface to suck the semiconductor wafer W with the intermediary of the adhesive tape T by a negative pressure and is connected to a suction source (not shown) via a pipe inside the holding part 32a. Around the holding part 32a, plural clamp parts 34a are provided with the intermediary of support arms extending radially outward. The plural clamp parts 34a are driven by an air actuator and clamp and fix the ring-shaped frame F around the semiconductor wafer W.

The second chuck table 3b has a configuration similar to that of the first chuck table 3a. Specifically, the second chuck table 3b has a θ table 31b that is fixed to the upper surface of the X-axis table 42b and is capable of rotating about the Z-axis and a holding part 32b that is provided on the θ table 31b and sucks and holds the semiconductor wafer W. The holding part 32b has a circular disc shape with a predetermined thickness and a holding surface 33b is formed at the center part of the upper surface thereof. The holding surface 33b is a surface to suck the semiconductor wafer W with the intermediary of the adhesive tape T by a negative pressure and is connected to a suction source (not shown) via a pipe inside the holding part 32b. Around the holding part 32b, plural clamp parts 34b are provided with the intermediary of support arms extending radially outward.

On the pedestal 2, a gate-shaped support frame 5 is so provided as to straddle the X-axis guide rails 41a and 41b. The support frame 5 has a pair of support column parts 51 provided upright on the pedestal 2 and a guide rail unit 52 that spans the space between the pair of support column parts 51. The pair of support column parts 51 are so disposed as to sandwich the X-axis guide rails 41a and 41b and be opposed to each other in the Y-axis direction, and the guide rail unit 52 is supported at the upper part of the pair of support column parts 51. By these pair of support column parts 51 and guide rail unit 52, an opening 53 that permits the movement of the first chuck table 3a and the second chuck table 3b in the X-axis direction is formed.

The guide rail unit 52 is formed by a single plate-shaped member extending along the Y-axis direction. First Y-axis guide rails 61a as a pair of upper and lower rails extending along the Y-axis direction are provided on one outside surface (side surface) 52a of this guide rail unit 52. Second Y-axis guide rails (not shown) as a pair of upper and lower rails extending along the Y-axis direction are provided on the other outside surface (side surface) 52b of the guide rail unit 52. On the first Y-axis guide rails 61a, the first cutting unit 8a and the second cutting unit 8b are provided movably in the Y-axis direction. On the second Y-axis guide rails, the third cutting unit 8c and the fourth cutting unit 8d (see FIG. 2) are provided movably in the Y-axis direction.

Two ball screws 62 and 63 are provided between the pair of first Y-axis guide rails 61a and a drive motor 64 is provided at one end part of each of the ball screws 62 and 63 (drive motor on the side of the ball screw 62 is not shown). Similarly, two ball screws are provided also between the pair of second Y-axis guide rails and a drive motor is provided at one end part of each of the ball screws (none of them is shown).

The first cutting unit 8*a* has a Y-axis table (first indexing feed base) 65*a* that is slidably disposed on the first Y-axis guide rails 61*a* and is driven by a motor, a pair of guide rails 71*a* that are disposed on the surface of the Y-axis table 65*a* and extend along the Z-axis direction in parallel to each other, and a Z-axis table (first cutting feed base) 72*a* that is slidably disposed on the pair of guide rails 71*a* and is driven by a motor. A first spindle 81*a* is mounted to the Z-axis table 72*a* with the intermediary of a connecting part 75*a*.

A nut part (not shown) is formed on the back surface side of the Y-axis table 65*a* and the ball screw 62 is screwed to this nut part. The drive motor (not shown) is connected to one end part of the ball screw 62 and the ball screw 62 is rotationally driven by this drive motor. This reciprocates the Y-axis table 65*a* in the Y-axis direction along the first Y-axis guide rails 61*a*.

A nut part (not shown) is formed on the back surface side of the Z-axis table 72*a* and a ball screw (not shown) is screwed to this nut part. A drive motor 73*a* is connected to one end part of the ball screw and the ball screw is rotationally driven by this drive motor 73*a*. This reciprocates the Z-axis table 72*a* in the Z-axis direction as the direction perpendicular to the holding surface 33*a* of the first chuck table 3*a* (holding surface 33*b* of the second chuck table 3*b*).

The connecting part 75*a* is so formed that the first spindle 81*a* is close to a third spindle 81*c* (see FIG. 2A) of the third cutting unit 8*c* in the opening 53. In the present embodiment, the connecting part 75*a* is formed into an inverted L-shape bent toward the third spindle 81*c*. Furthermore, the connecting part 75*a* is provided with a first imager 76*a* (see FIG. 2A) having an imaging element such as a CCD. The surface of the semiconductor wafer W is imaged by the imaging element of the first imager 76*a* and alignment processing is executed by matching a key pattern stored in advance with a key pattern included in an image obtained by the imaging.

The first spindle 81*a* has an axial core along the Y-axis direction and a first cutting blade 82*a* with a circular disc shape is provided on the side opposed to a second spindle 81*b* of the second cutting unit 8*b*. The first cutting blade 82*a* is rotated at high speed by the first spindle 81*a* to carry out cutting processing of the semiconductor wafer W while a cutting fluid is sprayed onto the cut part from plural nozzles (not shown).

The second cutting unit 8*b* has substantially the same configuration as the first cutting unit 8*a*. Specifically, the second cutting unit 8*b* has a Y-axis table (second indexing feed base) 65*b* that is slidably disposed on the first Y-axis guide rails 61*a* and is driven by a motor, a pair of guide rails 71*b* that are disposed on the surface of the Y-axis table 65*b* and extend along the Z-axis direction in parallel to each other, and a Z-axis table (second cutting feed base) 72*b* that is slidably disposed on the pair of guide rails 71*b* and is driven by a motor. The second spindle 81*b* is mounted to the Z-axis table 72*b* with the intermediary of a connecting part 75*b*.

A nut part (not shown) is formed on the back surface side of the Y-axis table 65*b* and the ball screw 63 is screwed to this nut part. The drive motor 64 is connected to one end part of the ball screw 63 and the ball screw 63 is rotationally driven by this drive motor 64. This reciprocates the Y-axis table 65*b* in the Y-axis direction along the first Y-axis guide rails 61*a*.

A nut part (not shown) is formed on the back surface side of the Z-axis table 72*b* and a ball screw (not shown) is screwed to this nut part. A drive motor 73*b* is connected to one end part of the ball screw and the ball screw is rotationally driven by this drive motor 73*b*. This reciprocates the Z-axis table 72*b* in the Z-axis direction as the direction perpendicular to the holding surface 33*b* of the second chuck table 3*b* (holding surface 33*a* of the first chuck table 3*a*).

Figure 2A:
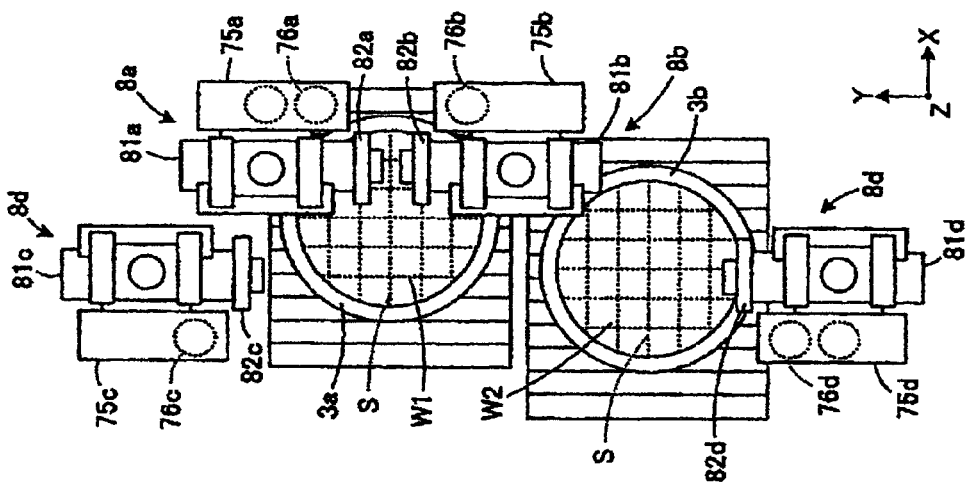
FIGS. 2A to 2C are schematic plan views for explaining operation examples of cutting processing by the cutting apparatus according to the embodiment.

The connecting part 75*b* is so formed that the second spindle 81*b* is close to a fourth spindle 81*d* of the fourth cutting unit 8*d* (see FIG. 2A). In the present embodiment, the connecting part 75*b* is formed into an inverted L-shape bent toward the fourth spindle 81*d*. Furthermore, the connecting part 75*b* is provided with a second imager 76*b* (see FIG. 2A) for alignment processing similarly to the connecting part 75*a*.

The second spindle 81*b* has an axial core along the Y-axis direction and a second cutting blade 82*b* with a circular disc shape is provided on the side opposed to the first spindle 81*a* (see FIG. 2A). The second cutting blade 82*b* is rotated at high speed by the second spindle 81*b* to carry out cutting processing of the semiconductor wafer W while a cutting fluid is sprayed onto the cut part from plural nozzles (not shown).

The third cutting unit 8*c* (see FIG. 2A) has substantially the same configuration as the first cutting unit 8*a*. Specifically, the third cutting unit 8*c* has a Y-axis table (third indexing feed base) 65*c* that is slidably disposed on the second Y-axis guide rails and is driven by a motor, a pair of guide rails 71*c* that are disposed on the surface of the Y-axis table 65*c* and extend along the Z-axis direction in parallel to each other, and a Z-axis table (third cutting feed base) 72*c* that is slidably disposed on the pair of guide rails 71*c* and is driven by a motor. The third spindle 81*c* (see FIG. 2) is mounted to the Z-axis table 72*c* with the intermediary of a connecting part 75*c*.

A nut part (not shown) is formed on the back surface side of the Y-axis table 65*c* and a ball screw (not shown) is screwed to this nut part. A drive motor (not shown) is connected to one end part of the ball screw and the ball screw is rotationally driven by this drive motor. This reciprocates the Y-axis table 65*c* in the Y-axis direction along the second Y-axis guide rails.

A nut part (not shown) is formed on the back surface side of the Z-axis table 72*c* and a ball screw (not shown) is screwed to this nut part. A drive motor 73*c* is connected to one end part of the ball screw and the ball screw is rotationally driven by this drive motor 73*c*. This reciprocates the Z-axis table 72*c* in the Z-axis direction as the direction perpendicular to the holding surface 33*a* of the first chuck table 3*a* (holding surface 33*b* of the second chuck table 3*b*).

The connecting part 75*c* is so formed that the third spindle 81*c* is close to the first spindle 81*a* in the opening 53 (see FIG. 2A). In the present embodiment, the connecting part 75*c* is formed into an inverted L-shape bent toward the first spindle 81*a*. Furthermore, the connecting part 75*c* is provided with a third imager 76*c* (see FIG. 2A) for alignment processing similarly to the connecting part 75*a*.

The third spindle 81*c* has an axial core along the Y-axis direction and a third cutting blade 82*c* with a circular disc shape is provided on the side opposed to the fourth spindle 81*d* (see FIG. 2A). The third cutting blade 82*c* is rotated at high speed by the third spindle 81*c* to carry out cutting processing of the semiconductor wafer W while a cutting fluid is sprayed onto the cut part from plural nozzles (not shown).

The fourth cutting unit 8*d* (see FIG. 2A) has substantially the same configuration as the first cutting unit 8*a*. Specifically, the fourth cutting unit 8*d* has a Y-axis table (fourth indexing feed base) 65*d* that is slidably disposed on the second Y-axis guide rails and is driven by a motor, a pair of guide rails 71*d* that are disposed on the surface of the Y-axis table 65*d* and extend along the Z-axis direction in parallel to each other, and a Z-axis table (fourth cutting feed base) 72*d* that is slidably disposed on the pair of guide rails 71*d* and is driven by a motor. The fourth spindle 81*d* is mounted to the Z-axis table 72*d* with the intermediary of a connecting part 75*d* (see FIG. 2A).

A nut part (not shown) is formed on the back surface side of the Y-axis table 65d and a ball screw (not shown) is screwed to this nut part. A drive motor (not shown) is connected to one end part of the ball screw and the ball screw is rotationally driven by this drive motor. This reciprocates the Y-axis table 65d in the Y-axis direction along the second Y-axis guide rails.

A nut part (not shown) is formed on the back surface side of the Z-axis table 72d and a ball screw (not shown) is screwed to this nut part. A drive motor 73d is connected to one end part of the ball screw and the ball screw is rotationally driven by this drive motor 73d. This reciprocates the Z-axis table 72d in the Z-axis direction as the direction perpendicular to the holding surface 33b of the second chuck table 3b (holding surface 33a of the first chuck table 3a).

The connecting part 75d is so formed that the fourth spindle 81d is close to the second spindle 81b (see FIG. 2A). In the present embodiment, the connecting part 75d is formed into an inverted L-shape bent toward the second spindle 81b. Furthermore, the connecting part 75d is provided with a fourth imager 76d (see FIG. 2A) for alignment processing similarly to the connecting part 75a.

The fourth spindle 81d has an axial core along the Y-axis direction and a fourth cutting blade 82d with a circular disc shape is provided on the side opposed to the third spindle 81c (see FIG. 2A). The fourth cutting blade 82d is rotated at high speed by the fourth spindle 81d to carry out cutting processing of the semiconductor wafer W while a cutting fluid is sprayed onto the cut part from plural nozzles (not shown).

In the cutting apparatus 1 configured in this manner, the first spindle 81a and the second spindle 81b are disposed in a state of being hung from the one side surface 52a of the guide rail unit 52 in the opening 53 of the support frame 5, with the first cutting blade 82a and the second cutting blade 82b opposed to each other in the Y-axis direction. Furthermore, the first spindle 81a and the second spindle 81b are so configured as to be movable closer to or farther from each other in the Y-axis direction. Therefore, the first cutting blade 82a and the second cutting blade 82b can be brought close to each other above the same semiconductor wafer W1 with an offset by a predetermined pitch interval in the Y-axis direction (see FIG. 2B). Similarly, the third spindle 81c and the fourth spindle 81d are disposed in a state of being hung from the other side surface 52b of the guide rail unit 52 in the opening 53 of the support frame 5, with the third cutting blade 82c and the fourth cutting blade 82d opposed to each other in the Y-axis direction. Furthermore, the third spindle 81c and the fourth spindle 81d are so configured as to be movable closer to or farther from each other in the Y-axis direction. Therefore, the third cutting blade 82c and the fourth cutting blade 82d can be brought close to each other above the same semiconductor wafer W2 with an offset by a predetermined pitch interval in the Y-axis direction (see FIG. 2B).

The connecting part 75a and the connecting part 75c are so formed as to bend in such a direction as to get closer to each other in the opening 53 of the support frame 5. Thus, the first spindle 81a attached to the connecting part 75a and the third spindle 81c attached to the connecting part 75c are disposed adjacent to each other in the X-axis direction. That is, the first cutting blade 82a provided on the first spindle 81a and the third cutting blade 82c provided on the third spindle 81c are disposed close to each other in the X-axis direction. Therefore, the first cutting blade 82a and the third cutting blade 82c can be disposed above the same semiconductor wafer W1 in a state of being lined on the same straight line extending along the X-axis direction (see FIG. 2A). Similarly, the connecting part 75b and the connecting part 75d are so formed as to bend in such a direction as to get closer to each other in the opening 53 of the support frame 5. Thus, the second spindle 81b attached to the connecting part 75b and the fourth spindle 81d attached to the connecting part 75d are disposed adjacent to each other in the X-axis direction. That is, the second cutting blade 82b provided on the second spindle 81b and the fourth cutting blade 82d provided on the fourth spindle 81d are disposed close to each other in the X-axis direction. Therefore, the second cutting blade 82b and the fourth cutting blade 82d can be disposed above the same semiconductor wafer W2 in a state of being lined on the same straight line extending along the X-axis direction (see FIG. 2A).

As above, in the cutting apparatus 1, when the cutting blades opposed to each other in the Y-axis direction are positioned above the same semiconductor wafer W, cutting processing referred to as a so-called facing dual-spindle method can be carried out. When the cutting blades close to each other in the X-axis direction are positioned above the same semiconductor wafer W, cutting processing referred to as a so-called parallel dual-spindle method can be carried out. This enhances the variations of the cutting processing. In addition, the throughput can be enhanced by simultaneously carrying out processing for two semiconductor wafers W.

Figure 2B:
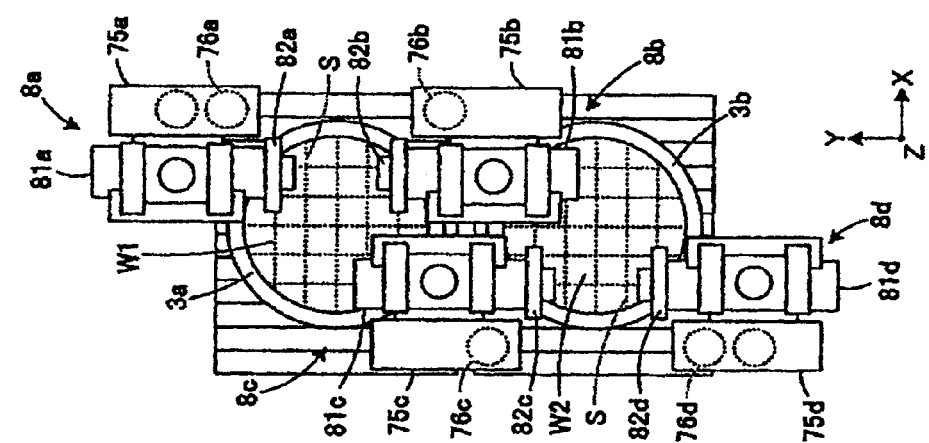
Figure 2C:
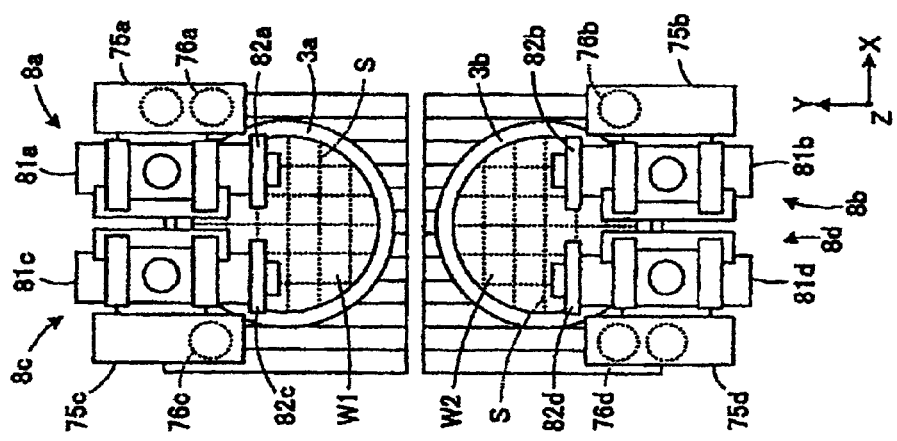

With reference to FIGS. 2A to 2C, operation examples of the cutting processing by the cutting apparatus 1 will be described in detail below. FIGS. 2A to 2C are explanatory diagrams showing the operation examples of the cutting processing by the cutting apparatus 1 according to the present embodiment. FIG. 2A shows an operation example when step cutting is carried out by the so-called parallel dual-spindle method. FIG. 2B shows an operation example when dual cutting is carried out by the facing dual-spindle method. FIG. 2C shows an operation example when step cutting is carried out by the facing dual-spindle method and ring cutting is carried out. Note that the processing operation examples shown below are absolutely one example and are not limited to these processing operation examples.

In FIG. 2A, a case is shown in which step cutting is carried out by the parallel dual-spindle method in such a manner that the first cutting blade 82a and the third cutting blade 82c close to each other in the X-axis direction are positioned above the semiconductor wafer W1 and the second cutting blade 82b and the fourth cutting blade 82d close to each other in the X-axis direction are positioned above the semiconductor wafer W2. Different kinds of cutting blades are attached to the two spindles juxtaposed in the X-axis direction. Here, suppose that blades for forming cut grooves (for surface film removal) are used as the first cutting blade 82a and the second cutting blade 82b and blades for dividing (for full cutting) are used as the third cutting blade 82c and the fourth cutting blade 82d.

First, the planned dividing lines S in a lattice manner on the semiconductor wafer W1 held by the first chuck table 3a are aligned to be set parallel to the X-axis direction and the Y-axis direction by the rotation of the θ table 31a (see FIG. 1). Similarly, the planned dividing lines S in a lattice manner on the semiconductor wafer W2 held by the second chuck table 3b are aligned to be set parallel to the X-axis direction and the Y-axis direction by the rotation of the θ table 31b (see FIG. 1).

Next, the first cutting blade 82a and the third cutting blade 82c are positioned above an extension of the planned dividing line S on one end side of the semiconductor wafer W1 in the Y-axis direction. At this time, the cutting depth of the first cutting blade 82a is so adjusted that the bottom of the cut groove is at a predetermined distance from the back surface of the semiconductor wafer W1. Furthermore, the cutting depth of the third cutting blade 82c is adjusted to such a cutting depth as to allow cutting of the semiconductor wafer W1.

Similarly, the second cutting blade 82b and the fourth cutting blade 82d are positioned above an extension of the planned dividing line S on one end side of the semiconductor wafer W2 in the Y-axis direction. At this time, the cutting depth of the second cutting blade 82b is so adjusted that the bottom of the cut groove is at a predetermined distance from the back surface of the semiconductor wafer W2. Furthermore, the cutting depth of the fourth cutting blade 82d is adjusted to such a cutting depth as to allow cutting of the semiconductor wafer W2.

Then, the first chuck table 3a is moved in the X-axis direction relative to the first cutting blade 82a and the third cutting blade 82c that rotate at high speed. Therefore, the semiconductor wafer W1 is partially cut by the first cutting blade 82a and a cut groove is formed along the planned dividing line S. Then, cutting into the cut groove formed by the cutting with the first cutting blade 82a is performed by the third cutting blade 82c, so that the semiconductor wafer W1 is divided. Similarly, the second chuck table 3b is moved in the X-axis direction relative to the second cutting blade 82b and the fourth cutting blade 82d that rotate at high speed. Therefore, the semiconductor wafer W2 is partially cut by the second cutting blade 82b and a cut groove is formed along the planned dividing line S. Then, cutting into the cut groove formed by the cutting with the second cutting blade 82b is performed by the fourth cutting blade 82d, so that the semiconductor wafer W2 is divided.

Every time processing of one planned dividing line S ends, the first cutting blade 82a and the third cutting blade 82c are moved in the Y-axis direction by the pitch interval of the planned dividing lines S to be positioned above an extension of the planned dividing line S that has not yet been processed on the semiconductor wafer W1. Similarly, every time processing of one planned dividing line S ends, the second cutting blade 82b and the fourth cutting blade 82d are moved in the Y-axis direction by the pitch interval of the planned dividing lines S to be positioned above an extension of the planned dividing line S that has not yet been processed on the semiconductor wafer W2. Then, the first chuck table 3a is moved in the X-axis direction relative to the first cutting blade 82a and the third cutting blade 82c and the second chuck table 3b is moved in the X-axis direction relative to the second cutting blade 82b and the fourth cutting blade 82d. By repetition of these operations, all planned dividing lines S along the X-axis direction on the semiconductor wafers W1 and W2 are processed. After all planned dividing lines S along the X-axis direction on the semiconductor wafers W1 and W2 are processed, the θ tables 31a and 31b (see FIG. 1) are rotated by 90 degrees and operation similar to the above description is repeated. Therefore, all planned dividing lines S on the semiconductor wafers W1 and W2 are processed.

In this manner, the respective planned dividing lines S on the semiconductor wafers W1 and W2 are simultaneously cut by two pairs of cutting blades juxtaposed in the X-axis direction. Therefore, the throughput can be enhanced. If blades for full cutting are used as both of the juxtaposed cutting blades and one cutting blade of them is positioned with an offset in the Y-axis direction by a predetermined pitch interval, it is also possible to simultaneously carry out cutting processing of two planned dividing lines S on the same semiconductor wafer W.

In FIG. 2B, a case is shown in which dual cutting is carried out by the facing dual-spindle method in such a manner that the first cutting blade 82a and the second cutting blade 82b opposed to each other in the Y-axis direction are positioned above the semiconductor wafer W1 and the third cutting blade 82c and the fourth cutting blade 82d opposed to each other in the Y-axis direction are positioned above the semiconductor wafer W2. Here, blades for full cutting are used as all cutting blades 82a to 82d.

First, the planned dividing lines S in a lattice manner on the semiconductor wafer W1 held by the first chuck table 3a are aligned to be set parallel to the X-axis direction and the Y-axis direction by the rotation of the θ table 31a (see FIG. 1). Similarly, the planned dividing lines S in a lattice manner on the semiconductor wafer W2 held by the second chuck table 3b are aligned to be set parallel to the X-axis direction and the Y-axis direction by the rotation of the θ table 31b (see FIG. 1).

Next, the first cutting blade 82a and the second cutting blade 82b opposed to each other in the Y-axis direction are positioned above extensions of the planned dividing lines S at both end parts of the semiconductor wafer W1 in the Y-axis direction. Specifically, the first cutting blade 82a and the second cutting blade 82b are positioned above the extensions of the planned dividing lines S located at both end parts of the semiconductor wafer W1 in the Y-axis direction in such a manner that the processing distances of these blades in the X-axis direction correspond with each other. At this time, the cutting depth of the first cutting blade 82a and the second cutting blade 82b is adjusted to such a cutting depth as to allow cutting of the semiconductor wafer W1. Similarly, the third cutting blade 82c and the fourth cutting blade 82d opposed to each other in the Y-axis direction are positioned above extensions of the planned dividing lines S at both end parts of the semiconductor wafer W2 in the Y-axis direction. Specifically, the third cutting blade 82c and the fourth cutting blade 82d are positioned above the extensions of the planned dividing lines S located at both end parts of the semiconductor wafer W2 in the Y-axis direction in such a manner that the processing distances of these blades in the X-axis direction correspond with each other. At this time, the cutting depth of the third cutting blade 82c and the fourth cutting blade 82d is adjusted to such a cutting depth as to allow cutting of the semiconductor wafer W2.

Then, the first chuck table 3a is moved in the X-axis direction relative to the first cutting blade 82a and the second cutting blade 82b that rotate at high speed. Therefore, the planned dividing lines S at both end parts on the semiconductor wafer W1 are simultaneously cut in the same stroke by the first cutting blade 82a and the second cutting blade 82b, so that the semiconductor wafer W1 is divided. Similarly, the second chuck table 3b is moved in the X-axis direction relative to the third cutting blade 82c and the fourth cutting blade 82d that rotate at high speed. Therefore, the planned dividing lines S at both end parts on the semiconductor wafer W2 are simultaneously cut in the same stroke by the third cutting blade 82c and the fourth cutting blade 82d, so that the semiconductor wafer W2 is divided.

Every time processing of two planned dividing lines S ends, the first cutting blade 82a and the second cutting blade 82b are moved in the Y-axis direction from the end side of the semiconductor wafer W1 toward the center thereof by the pitch interval of the planned dividing lines S to be positioned above extensions of the planned dividing lines S that have not yet been processed on the semiconductor wafer W1. Also at this time, the first cutting blade 82a and the second cutting blade 82b are positioned above the extensions of the planned dividing lines S of the semiconductor wafer W1 in such a manner that the processing distances of these blades in the X-axis direction correspond with each other. Similarly, every time processing of two planned dividing lines S ends, the third cutting blade 82c and the fourth cutting blade 82d are moved in the Y-axis direction from the end side of the semiconductor wafer W2 toward the center thereof by the pitch interval of the planned dividing lines S to be positioned above extensions of the planned dividing lines S that have not yet been processed on the semiconductor wafer W2. Also at this time, the third cutting blade 82c and the fourth cutting blade 82d are positioned above the extensions of the planned dividing lines S of the semiconductor wafer W2 in such a manner that the processing distances of these blades in the X-axis direction correspond with each other. Then, the first chuck table 3a is moved in the X-axis direction relative to the first cutting blade 82a and the second cutting blade 82b and the second chuck table 3b is moved in the X-axis direction relative to the third cutting blade 82c and the fourth cutting blade 82d. By repetition of these operations, all planned dividing lines S extending along the X-axis direction on the semiconductor wafers W1 and W2 are processed. After all planned dividing lines S extending along the X-axis direction on the semiconductor wafers W1 and W2 are processed, the θ tables 31a and 31b (see FIG. 1) are rotated by 90 degrees and operation similar to the above description is repeated. Therefore, all planned dividing lines S on the semiconductor wafers W1 and W2 are processed.

In this manner, by two pairs of cutting blades opposed to each other in the Y-axis direction, the respective planned dividing lines S of the semiconductor wafers W1 and W2 are simultaneously cut two by two in the same stroke without waste. Thus, the throughput can be enhanced. Although the processing is carried out from the planned dividing lines S at both end parts of the semiconductor wafer W in the Y-axis direction toward the center thereof in the processing operation example shown in FIG. 2B, the processing may be carried out from the planned dividing lines S on the center side of the semiconductor wafer W toward the outside in the Y-axis direction. It is also possible to carry out step cutting if a blade for forming cut grooves (for surface film removal) is used as one of the cutting blades opposed in the Y-axis direction and a blade for dividing (for full cutting) is used as the other cutting blade. In this case, after cut grooves are formed along the planned dividing lines S by the cutting blade for forming cut grooves, cutting into the cut grooves is carried out by the cutting blade for full cutting and the semiconductor wafer W is divided.

In FIG. 2C, a case is shown in which step cutting is carried out by the facing dual-spindle method in such a manner that the first cutting blade 82a and the second cutting blade 82b opposed to each other in the Y-axis direction are positioned above the semiconductor wafer W1 and ring cutting (circle cutting) is carried out with the fourth cutting blade 82d positioned above the semiconductor wafer W2. Here, suppose that a blade for forming cut grooves (for surface film removal) is used as the first cutting blade 82a and a blade for dividing (full cutting) is used as the second cutting blade 82b. Furthermore, a blade for ring cutting is used as the fourth cutting blade 82d.

First, the planned dividing lines S in a lattice manner on the semiconductor wafer W1 held by the first chuck table 3a are aligned to be set parallel to the X-axis direction and the Y-axis direction by the rotation of the θ table 31a (see FIG. 1). Next, the first cutting blade 82a is positioned above an extension of the planned dividing line S on one end side of the semiconductor wafer W1 in the Y-axis direction. At this time, the cutting depth of the first cutting blade 82a is so adjusted that the bottom of the cut groove is at a predetermined distance from the back surface of the semiconductor wafer W1. On the other hand, the fourth cutting blade 82d is located at a position facing the circumferential part of the semiconductor wafer W2.

Then, the first chuck table 3a is moved in the X-axis direction relative to the first cutting blade 82a that rotates at high speed. Therefore, the semiconductor wafer W1 is partially cut and a cut groove is formed on the planned dividing line S. After the cut groove is formed on one planned dividing line S, the first cutting blade 82a is moved in the Y-axis direction from the end side of the semiconductor wafer W1 toward the center thereof by the pitch interval of the planned dividing lines S to be positioned above an extension of the planned dividing line S that has not yet been processed on the semiconductor wafer W1. Furthermore, the second cutting blade 82b is positioned above an extension of the planned dividing line S along which the cut groove has been formed on the semiconductor wafer W1. At this time, the cutting depth of the second cutting blade 82b is adjusted to such a cutting depth as to allow cutting of the semiconductor wafer W1.

Then, the first chuck table 3a is moved in the X-axis direction relative to the first cutting blade 82a and the second cutting blade 82b that rotate at high speed. Therefore, a cut groove is formed on the planned dividing line S that has not yet been processed on the semiconductor wafer W1 by the first cutting blade 82a. In addition, cutting into the cut groove formed on the semiconductor wafer W1 is carried out by the second cutting blade 82b, so that the semiconductor wafer W1 is divided.

Every time processing of one planned dividing line S ends in this manner, the first cutting blade 82a is moved in the Y-axis direction by the pitch interval of the planned dividing lines S to be positioned above an extension of the planned dividing line S that has not yet been processed on the semiconductor wafer W1. Furthermore, the second cutting blade 82b is moved in the Y-axis direction by the pitch interval of the planned dividing lines S to be positioned above an extension of the planned dividing line S along which a cut groove has been formed on the semiconductor wafer W1. Then, the first chuck table 3a is moved in the X-axis direction relative to the first cutting blade 82a and the second cutting blade 82b. By repetition of these operations, all planned dividing lines S extending along the X-axis direction on the semiconductor wafer W1 are processed. After all planned dividing lines S extending along the X-axis direction on the semiconductor wafer W1 are processed, the θ table 31a (see FIG. 1) is rotated by 90 degrees and operation similar to the above description is repeated. Therefore, all planned dividing lines S on the semiconductor wafer W1 are processed.

On the other hand, the fourth cutting blade 82d is positioned at an arc-shaped chamfering part (circumferential redundant region) formed at the circumferential part of the semiconductor wafer W2. The fourth cutting blade 82d that rotates at high speed moves down and the circumferential part of the semiconductor wafer W2 on the rotating second chuck table 3b is cut. By the cutting of the circumferential part of the rotating semiconductor wafer W2 by the fourth cutting blade 82d, chamfering processing of the circumferential part of the semiconductor wafer W2 is carried out.

As shown in FIGS. 2A to 2C, by changing the placement positions of the four spindles (cutting blades) and the kinds of blades, the flexibility in cutting processing is enhanced and plural kinds of cutting processing can be carried out. In addition, the throughput can be enhanced.

As described above, in the cutting apparatus 1 according to the present embodiment, the first Y-axis guide rails 61a are disposed on the one side surface 52a of the guide rail unit 52 forming the gate-shaped support frame 5 and the second Y-axis guide rails are disposed on the other side surface 52b. Furthermore, in the opening 53 of the support frame 5, the spindles opposed to each other in the Y-axis direction are disposed in a hung state with the respective cutting blades opposed to each other. Therefore, the four-axis spindles can be disposed without increasing the size of the whole apparatus. This can prevent increase in the apparatus area due to increase in the diameter of the workpiece and enhance the productivity.

Figure 3:
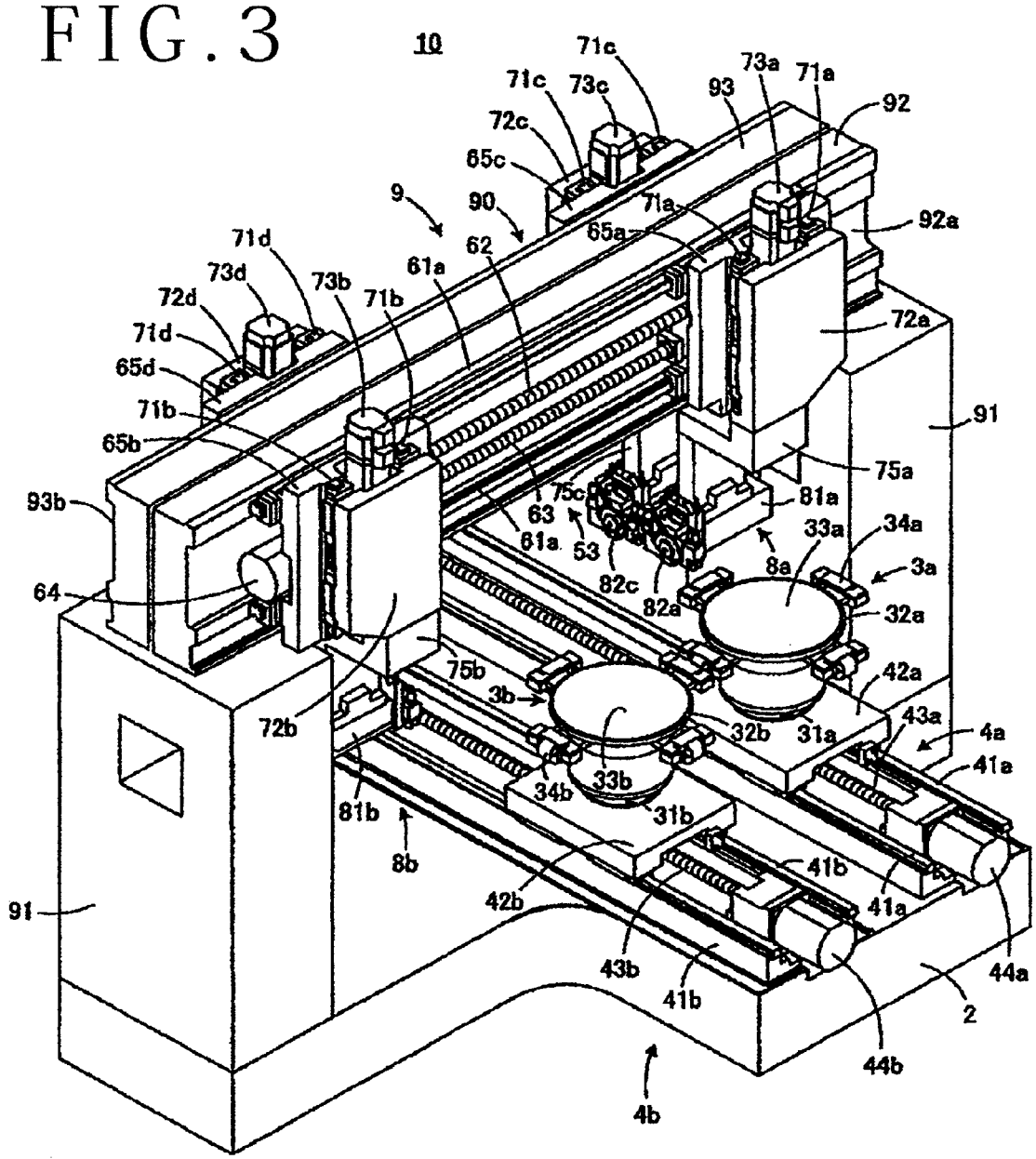
FIG. 3 is a perspective view of cutting apparatus according to a second embodiment of the present invention.

Next, cutting apparatus according to a second embodiment will be described by using FIG. 3. FIG. 3 is a perspective view of the cutting apparatus according to the second embodiment. Cutting apparatus 10 according to the second embodiment is different from the cutting apparatus 1 according to the above-described first embodiment only in the configuration of a gate-shaped support frame 9. Therefore, only the different point will be especially described. Furthermore, the same numeral will be used for the same configuration and repetitive description will be omitted.

As shown in FIG. 3, the gate-shaped support frame 9 has a pair of support column parts 91 provided upright on a pedestal 2 and a guide rail unit 90 that spans the space between the pair of support column parts 91. The guide rail unit 90 is formed by two plate-shaped members 92 and 93 extending along the Y-axis direction. The pair of support column parts 91 are so disposed as to sandwich X-axis guide rails 41a and 41b and be opposed to each other in the Y-axis direction. The two plate-shaped members 92 and 93 are each supported at the upper part of the pair of support column parts 91 in a state of being disposed in parallel to the Y-axis direction. By these pair of support column parts 91 and two plate-shaped members 92 and 93, an opening 53 that permits the movement of a first chuck table 3a and a second chuck table 3b in the X-axis direction is formed.

First Y-axis guide rails 61a as a pair of upper and lower rails extending along the Y-axis direction are provided on an outside surface (side surface) 92a of the plate-shaped member 92. Second Y-axis guide rails (not shown) as a pair of upper and lower rails extending along the Y-axis direction are provided on an outside surface (side surface) 93b of the plate-shaped member 93. On the first Y-axis guide rails 61a, a first cutting unit 8a and a second cutting unit 8b are provided movably in the Y-axis direction. On the second Y-axis guide rails, a third cutting unit 8c and a fourth cutting unit 8d are provided movably in the Y-axis direction (in FIG. 3, neither the third cutting unit 8c nor the fourth cutting unit 8d is shown).

As described above, in the cutting apparatus 10 according to the second embodiment, the first Y-axis guide rails 61a are disposed on the one side surface 92a of the guide rail unit 90 (plate-shaped member 92) forming the gate-shaped support frame 9 and the second Y-axis guide rails are disposed on the other side surface 93b of the guide rail unit 90 (plate-shaped member 93). Furthermore, in the opening 53 of the support frame 9, spindles opposed to each other in the Y-axis direction are disposed in a hung state with the respective cutting blades opposed to each other. Therefore, the four-axis spindles can be disposed without increasing the size of the whole apparatus. This can prevent increase in the apparatus area due to increase in the diameter of the workpiece and enhance the productivity.

The above-described embodiments have a configuration in which the two X-axis guide rails 41a and 41b are provided on the pedestal 2. However, the configuration is not limited thereto. For example, a configuration may be employed in which three or more X-axis guide rails are disposed on the pedestal 2 and a cutting feed mechanism and a chuck table are disposed over each X-axis guide rail.

Furthermore, the embodiments disclosed in this specification are examples in all points and the present invention is not limited to the embodiments. The scope of the present invention is shown by not the explanation of only the above-described embodiments but the scope of the claims and is intended to include all changes that fall within the meanings and scope equivalent to the scope of the claims.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A cutting apparatus comprising:
a first X-axis guide rail extended along an X-axis direction;
a first chuck table that is disposed movably along the first X-axis guide rail and has a first holding surface to hold a first workpiece;
a first cutting feed mechanism that carries out cutting feed of the first chuck table along the first X-axis guide rail;
a second X-axis guide rail extended along the X-axis direction;
a second chuck table that is disposed movably along the second X-axis guide rail and has a second holding surface to hold a second workpiece;
a second cutting feed mechanism that carries out cutting feed of the second chuck table along the second X-axis guide rail;
first and second Y-axis guide rails that are so disposed as to extend along a direction perpendicular to the first and second X-axis guide rails;
a cutting mechanism that is disposed movably along the first and second Y-axis guide rails and is to cut the first and second workpieces held by the first and second chuck tables; and
a gate-shaped support frame having a pair of support column parts that sandwich the first and second X-axis guide rails and are provided upright opposed to each other and a guide rail unit that straddles the first and second X-axis guide rails and spans a space between the pair of support column parts, the gate-shaped support frame having an opening that permits movement of the first and second chuck tables, wherein
the first Y-axis guide rail extends on a first side surface of the guide rail unit and the second Y-axis guide rail extends on a second side surface of the guide rail units,
said cutting mechanism includes
a first cutting unit having a first cutting blade, and a second cutting unit having a second cutting blade that are each disposed movably along the first Y-axis guide rail, and
a third cutting unit having a third cutting blade and a fourth cutting unit having a fourth cutting blade that are each disposed movably along the second Y-axis guide rail,
the first cutting unit has a first indexing feed base movably disposed in a direction along the first Y-axis guide rail, a first cutting feed base disposed over the first indexing feed base movably in a direction perpendicular to the first holding surface of the first chuck table, and a first spindle that is mounted to the first cutting feed base and has the first cutting blade,
the second cutting unit has a second indexing feed base movably disposed in a direction along the first Y-axis guide rail, a second cutting feed base disposed over the second indexing feed base movably in a direction perpendicular to the first and second holding surfaces of the first and second chuck tables, and a second spindle that is mounted to the second cutting feed base and has the second cutting blade, the first spindle and the second spindle are disposed opposed to each other in a hung state in the opening of the gate-shaped support frame in such a manner that the first cutting blade and the second cutting blade face each other on the first chuck table, and cut said first workpiece on the first holding surface, wherein the first cutting blade and the second cutting blade cut said first workpiece in the same stroke by a dual-cutting facing dual spindle method, the third cutting unit has a third indexing feed base movably disposed in a direction on the second Y-axis guide rail, a third cutting feed base disposed over the third indexing feed base movably in a direction perpendicular to the first and second holding surfaces of the first and second chuck tables, and a third spindle that is mounted to the third cutting feed base and has the third cutting blade, the fourth cutting unit has a fourth indexing feed base movably disposed in a direction along the second Y-axis guide rail, a fourth cutting feed base disposed over the fourth indexing feed base movably in a direction perpendicular to the second holding surface of the second chuck table, and a fourth spindle that is mounted to the fourth cutting feed base and has the fourth cutting blade, the third spindle and the fourth spindle are disposed opposed to each other in a hung state in the opening of the gate-shaped support frame in such a manner that the third cutting blade and the fourth cutting blade face each other on the second chuck table, and cut said second workpiece, wherein the third cutting blade and the fourth cutting blade cut said second workpiece in the same stroke by the dual-cutting facing dual spindle method, the first spindle and the third spindle are movable in juxtaposition to each other in the opening of the gate-shaped support frame and the first and third cutting blades cut said first workpiece on said first holding surface, wherein the first cutting blade partially cuts said first workpiece to make a first cut groove, and the third cutting blade cuts into said first cut groove to divide said first workpiece by a parallel dual spindle method, and the second spindle and the fourth spindle are movable in juxtaposition to each other in the opening of the gate-shaped support frame and said second and fourth cutting blades cut said second workpiece on the second holding surface, wherein the second cutting blade partially cuts said second workpiece to make a second cut groove, and the fourth cutting blade cuts into said second cut groove to divide said second workpiece by the parallel dual spindle method.

2. The cutting apparatus according to claim 1, wherein at least two X-axis guide rails are juxtaposed as the X-axis guide rail and the cutting feed mechanism and the chuck table are disposed over each of the X-axis guide units.

* * * * *